United States Patent
Rocha-Alvarez et al.

(10) Patent No.: US 10,544,508 B2
(45) Date of Patent: *Jan. 28, 2020

(54) CONTROLLING TEMPERATURE IN SUBSTRATE PROCESSING SYSTEMS

(71) Applicant: Applied Materials, Inc., Santa Clara, CA (US)

(72) Inventors: Juan Carlos Rocha-Alvarez, San Carlos, CA (US); Amit Kumar Bansal, Sunnyvale, CA (US); Ganesh Balasubramanian, Sunnyvale, CA (US); Jianhua Zhou, Campbell, CA (US); Ramprakash Sankarakrishnan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1007 days.

This patent is subject to a terminal disclaimer.

(21) Appl. No.: 14/035,138

(22) Filed: Sep. 24, 2013

(65) Prior Publication Data

US 2014/0083361 A1    Mar. 27, 2014

Related U.S. Application Data

(60) Provisional application No. 61/706,104, filed on Sep. 26, 2012.

(51) Int. Cl.
C23C 16/50      (2006.01)
H01L 21/67      (2006.01)
H01J 37/32      (2006.01)

(52) U.S. Cl.
CPC .......... *C23C 16/50* (2013.01); *H01J 37/3244* (2013.01); *H01J 37/32091* (2013.01); *H01J 37/32522* (2013.01); *H01L 21/6719* (2013.01)

(58) Field of Classification Search
None
See application file for complete search history.

(56) References Cited

U.S. PATENT DOCUMENTS 6,079,356 A  *  6/2000  Umotoy ................ C23C 16/455
                                                  118/723 E
6,123,775 A  *  9/2000  Hao .................. C23C 16/45572
                                                  118/715

(Continued)

FOREIGN PATENT DOCUMENTS

JP          2003257937 A      9/2003
JP          2004342704 A     12/2004

(Continued)

OTHER PUBLICATIONS

The International Search Report and The Written Opinion of the International Searching Authority; PCT/US2013/061375, dated Jan. 13, 2014.

*Primary Examiner* — Karla A Moore
*Assistant Examiner* — Margaret D Klunk
(74) *Attorney, Agent, or Firm* — Patterson + Sheridan LLP

(57) ABSTRACT

An apparatus for plasma processing a substrate is provided. The apparatus comprises a processing chamber, a substrate support disposed in the processing chamber, and a lid assembly coupled to the processing chamber. The lid assembly comprises a conductive gas distributor such as a face plate coupled to a power source, and a heater coupled to the conductive gas distributor. A zoned blocker plate is coupled to the conductive gas distributor and a cooled gas cap is coupled to the zoned blocker plate. A tuning electrode may be disposed between the conductive gas distributor and the chamber body for adjusting a ground pathway of the plasma.

(Continued)

A second tuning electrode may be coupled to the substrate support, and a bias electrode may also be coupled to the substrate support.

18 Claims, 2 Drawing Sheets

(56) References Cited

U.S. PATENT DOCUMENTS

| | | | |
|---|---|---|---|
| 6,259,334 B1 * | 7/2001 | Howald | H01J 37/32183 315/111.21 |
| 8,137,467 B2 | 3/2012 | Meinhold et al. | |
| 8,673,080 B2 | 3/2014 | Meinhold et al. | |
| 9,816,187 B2 * | 11/2017 | Rajagopalan | |
| 2003/0079983 A1 * | 5/2003 | Long et al. | |
| 2006/0137607 A1 | 6/2006 | Seo et al. | |
| 2010/0151687 A1 | 6/2010 | Dhindsa et al. | |
| 2011/0180233 A1 * | 7/2011 | Bera | H01L 21/67109 165/47 |
| 2011/0294303 A1 * | 12/2011 | Sankarakrishnan | C23C 16/46 438/758 |
| 2012/0097330 A1 * | 4/2012 | Iyengar et al. | |
| 2013/0126476 A1 | 5/2013 | Marakhtanov et al. | |
| 2015/0226540 A1 * | 8/2015 | Rajagopalan | H01L 21/00 118/728 |
| 2016/0017497 A1 * | 1/2016 | Rajagopalan | H01L 21/00 118/712 |
| 2017/0016118 A1 * | 1/2017 | Rajagopalan | H01L 21/00 |

FOREIGN PATENT DOCUMENTS

| | | |
|---|---|---|
| JP | 2007027490 A | 2/2007 |
| KR | 20110080458 A | 7/2011 |
| KR | 10-1060774 B1 | 8/2011 |
| WO | 2008123605 A1 | 10/2008 |

* cited by examiner

CONTROLLING TEMPERATURE IN SUBSTRATE PROCESSING SYSTEMS

CROSS-REFERENCE TO RELATED APPLICATIONS

This application claims benefit of U.S. provisional patent application Ser. No. 61/706,104, filed Sep. 26, 2012, which is herein incorporated by reference.

FIELD

Embodiments described herein relate to semiconductor manufacturing apparatus and methods. Specifically, embodiments described herein relate to plasma processing chambers for semiconductor substrates.

BACKGROUND

For over 50 years, the number of transistors formed on an integrated circuit has doubled approximately every two years. This two-year-doubling trend, also known as Moore's Law, is projected to continue, with devices formed on semiconductor chips shrinking from the current critical dimension of 20-30 nm to below 100 Angstroms in future fabrication processes currently being designed. As device geometries shrink, fabrication geometries grow. As the 300 mm wafer replaced the 200 mm wafer years ago, the 300 mm wafer will shortly be replaced by the 400 mm wafer. With processing of large area semiconductor substrate growing in sophistication, even larger fabrication geometries for logic chips may be within reach.

Uniformity in processing conditions has always been important to semiconductor manufacturing, and as critical dimensions of devices continue to decline and fab geometries increase, tolerance for non-uniformity also declines. Non-uniformity arises from numerous causes, which may be related to device properties, equipment features, and the chemistry and physics of fabrication processes. As the semiconductor manufacturing industry progresses along Moore's Law, there is a continuing need for fabrication processes and equipment capable of very uniform processing.

SUMMARY

Embodiments described herein provide an apparatus for processing a semiconductor substrate, with a processing chamber, a substrate support disposed in the processing chamber, and a lid assembly comprising a conductive gas distributor coupled to a source of electric power and a heater contacting the conductive gas distributor. The lid assembly may also have a zoned blocker plate coupled to the conductive gas distributor that provides multiple separate pathways for process gases into the interior of the processing chamber. A gas cap provides portals to the various gas pathways, and includes a thermal control conduit for circulating a fluid.

An electrode may be positioned between the conductive gas distributor and the body of the processing chamber. The electrode may be a tuning electrode for adjusting plasma conditions in the chamber, and may be an annular member surrounding a portion of the processing volume. The electrode may be coupled to a tuning circuit, which may be an LLC circuit comprising an electronic controller such as a variable capacitor, which may be used to adjust a ground pathway of the processing chamber. An electronic sensor may be used to monitor an electrical condition of the electrode 108, and may be coupled to the electronic controller for real-time, closed-loop control.

One or two electrodes may also be coupled to the substrate support. One electrode may be a bias electrode, and may be coupled to a source of electric power. The other electrode may be a second tuning electrode, and may be coupled to a second tuning circuit having a second electronic sensor and a second electronic controller.

The heater and thermal control conduits of the lid assembly may be used to control a temperature of the conductive gas distributor during substrate processing, while the first and second tuning electrodes may be used to control deposition rate and thickness uniformity independently.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
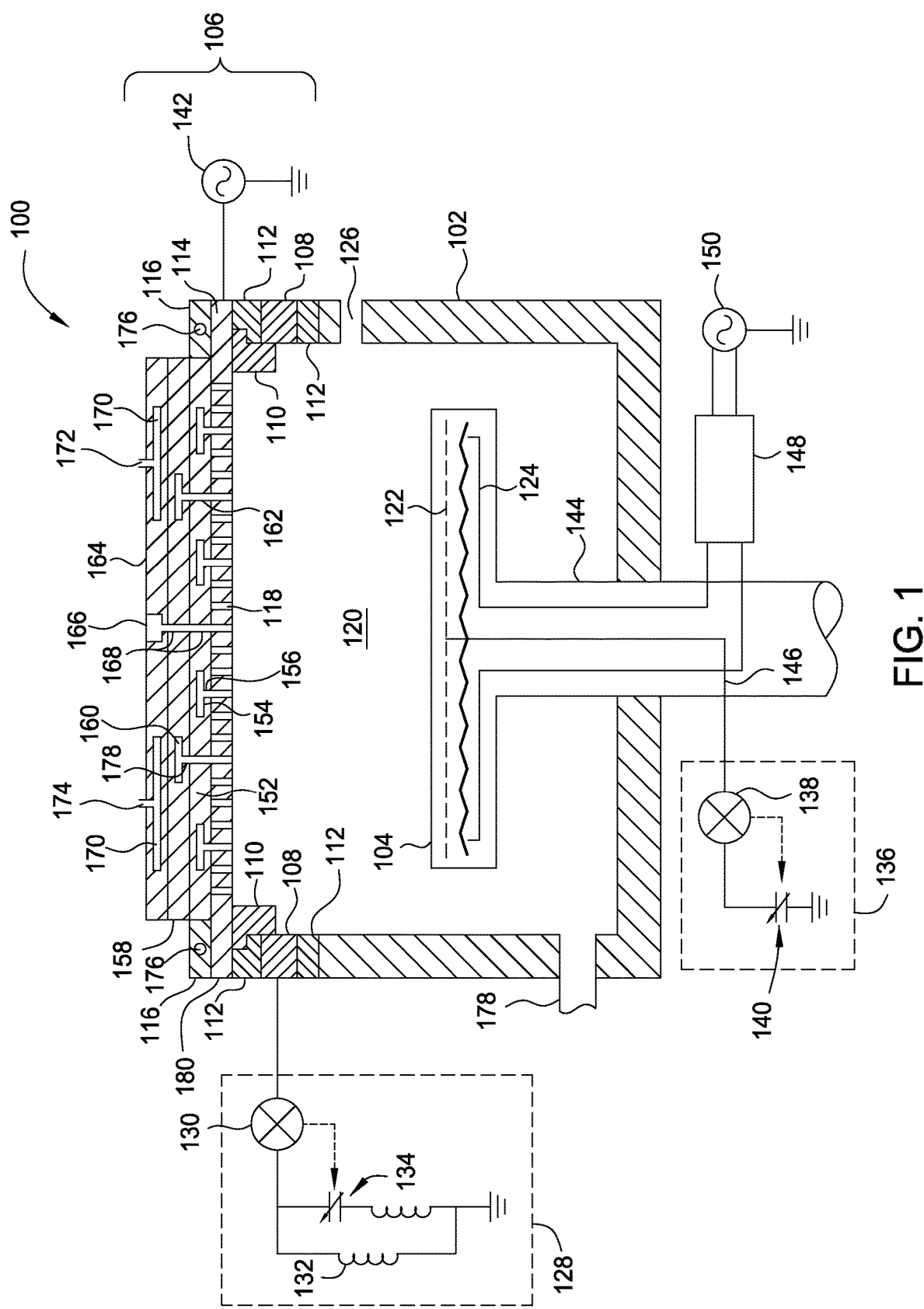
FIG. 1 is a schematic cross-sectional view of a processing chamber 100 according to one embodiment.

Embodiments described herein provide an apparatus for processing a semiconductor substrate. FIG. 1 is a schematic cross-sectional view of a processing chamber 100, according to one embodiment. The processing chamber 100 features a chamber body 102, a substrate support 104 disposed inside the chamber body 102, and a lid assembly 106 coupled to the chamber body 102 and enclosing the substrate support 104 in a processing volume 120. Substrates are provided to the processing volume 120 through an opening 126, which may be conventionally sealed for processing using a door.

The lid assembly 106 comprises an electrode 108 disposed adjacent to the chamber body 102 and separating the chamber body 102 from other components of the lid assembly 106. The electrode 108 may be an annular, or ring-like member, and may be a ring electrode. The electrode 108 may be a continuous loop around a circumference of the processing chamber 100 surrounding the processing volume 120, or may be discontinuous at selected locations if desired. A pair of isolators 110 and 112, each of which may be a dielectric material such as a ceramic or metal oxide, for example aluminum oxide and/or aluminum nitride, contacts the electrode 108 and separates the electrode 108 electrically and thermally from a conductive gas distributor 114. The conductive gas distributor 114, which may be a conductive face plate, is in thermal contact, and may be in physical contact, with a heater 116.

In an embodiment where the conductive gas distributor 114 is a conductive face plate, the conductive face plate may be a flat, conductive, plate-like member having a substantially uniform thickness, and a surface of the conductive face plate may be substantially parallel to an upper surface of the substrate support 104. The conductive face plate may be metal, such as aluminum or stainless steel and may be coated in some embodiments with a dielectric material such as aluminum oxide or aluminum nitride.

The heater 116 includes a heating element 176, which may be resistive element, such as an electrical conductor designed to radiate heat, or a conductive element, such as a conduit for a heating fluid. The conductive gas distributor 114 features openings 118 for admitting process gas into the processing volume 120. An edge portion 180 of the conductive gas distributor 114 is accessible along the side of the processing chamber 100 to allow coupling of the conductive gas distributor 114 to a source of electric power 142, such as an RF generator. DC power, pulsed DC power, and pulsed RF power may also be used.

A zoned blocker plate comprising a first zoned plate 152 and a second zoned plate 158 contacts the conductive gas distributor 114 and provides multiple gas pathways through the lid assembly 106. While the embodiment shown in FIG. 1 is an example of one configuration of such a zoned blocker plate, other configurations of a zoned blocker plate, including configurations having more than two zoned plates, are conceivable. The first zoned plate 152 has one or more plenums 154 for circulating process gases through a first pathway for distribution to the processing volume 120 through openings 156 in the first zoned plate that are in fluid communication with the openings 118 of the conductive gas distributor 114. The second zoned plate 158 also has one or more plenums 160 for circulating process gases through a second pathway for distribution to the processing volume 120 through openings 178 in the second zoned plate that are in fluid communication with pass-through openings 162 of the first zoned plate 152 and the openings 118 of the conductive gas distributor 114.

A gas cap 164 is disposed in contact with the second zoned plate 158, and provides portals for flowing process gases separately to the plenums 154 in the first zoned plate 152 and the plenums 160 in the second zoned plate 158, allowing the process gases to flow to the processing volume 120 without contacting each other prior to arriving in the processing volume 120. The gas cap 164 also features a portal 166 in fluid communication with a pass-through opening 168 in the second zoned plate 158 and the first zoned plate 152, and with one of the openings 118, for passing process gas directly into the processing volume 120 through a third gas pathway, if desired. The gas cap 164 also features a conduit 170 for circulating a fluid through the gas cap 164. The fluid may be a thermal control fluid, such as a cooling fluid. Water is an example of a cooling fluid that may be used, but other fluids, liquid and solid, may also be used. The thermal control fluid is provided to the conduit 170 through an inlet 172 and is withdrawn from the conduit 170 through an outlet 174. The gas cap 164 is in thermal communication with the first and second zoned plates 152 and 158, and with the conductive gas distributor 114. The heater 116 and the thermally controlled gas cap 164 together provide thermal control for the conductive gas distributor 114 to allow temperature uniformity from edge to center and from substrate to substrate. Gases are evacuated from the processing volume 120 through a portal 178, which may be coupled to a vacuum source (not shown), which may be located at any convenient location along the chamber body, and which may be associated with a pumping plenum, if desired.

The electrode 108 may be coupled to a tuning circuit 128 that controls a ground pathway of the processing chamber 100. The tuning circuit 128 comprises an electronic sensor 130 and an electronic controller 134, which may be a variable capacitor. The tuning circuit 128 may be an LLC circuit comprising one or more inductors 132. The electronic sensor 130 may be a voltage or current sensor, and may be coupled to the electronic controller 134 to afford a degree of closed-loop control of plasma conditions inside the processing volume 120.

A second electrode 122 may be coupled to the substrate support 104. The second electrode 122 may be embedded within the substrate support 104 or coupled to a surface of the substrate support 104. The second electrode 122 may be a plate, a perforated plate, a mesh, a wire screen, or any other distributed arrangement. The second electrode 122 may be a tuning electrode, and may be coupled to a second tuning circuit 136 by a conduit 146, for example a cable having a selected resistance such as 50Ω, disposed in a shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode, may be coupled to the substrate support 104. The third electrode may be coupled to a second source of electric power 150 through a filter 148, which may be an impedance matching circuit. The second source of electric power 150 may be DC power, pulsed DC power, RF power, pulsed RF power, or a combination thereof.

The lid assembly 106 and substrate support 104 of FIG. 1 may be used with any processing chamber for plasma or thermal processing. One example of a plasma processing chamber with which the lid assembly 106 and substrate support 104 may be beneficially used is the PRODUCER® platform and chambers available from Applied Materials, Inc., located in Santa Clara, Calif. Chambers from other manufacturers may also be used with the components described above.

In operation, the processing chamber 100 affords real-time control of temperature in the lid assembly 106 and of plasma conditions in the processing volume 120. A substrate is disposed on the substrate support 104, and process gases are flowed through the lid assembly 106 according to any desired flow plan. A temperature set point is established for the conductive gas distributor, and is controlled by operation of the heater 116 and by circulation of a cooling fluid through the conduit 170. Electric power is coupled to the conductive gas distributor 114 to establish a plasma in the processing volume 120. Because the temperature of the conductive gas distributor 114 is controlled, less electric power is dissipated through heating of the conductive gas distributor 114 and other components of the lid assembly 106, and the temperature of the conductive gas distributor 114 is stabilized from center to edge and from substrate to substrate, beginning with the first substrate processed in the processing chamber 100. The substrate may be subjected to an electrical bias using the third electrode 124, if desired.

Upon energizing a plasma in the processing volume 120, a potential difference is established between the plasma and the first electrode 108. A potential difference is also established between the plasma and the second electrode 122. The electronic controllers 134 and 140 may then be used to adjust the flow properties of the ground paths represented by the two tuning circuits 128 and 136. A set point may be delivered to the first tuning circuit 128 and the second tuning circuit 136 to provide independent control of the plasma density uniformity from center to edge and deposition rate. In embodiments where the electronic controllers are both variable capacitors, the electronic sensors may adjust the variable capacitors to maximize deposition rate and minimize thickness non-uniformity independently.

Figure 2:
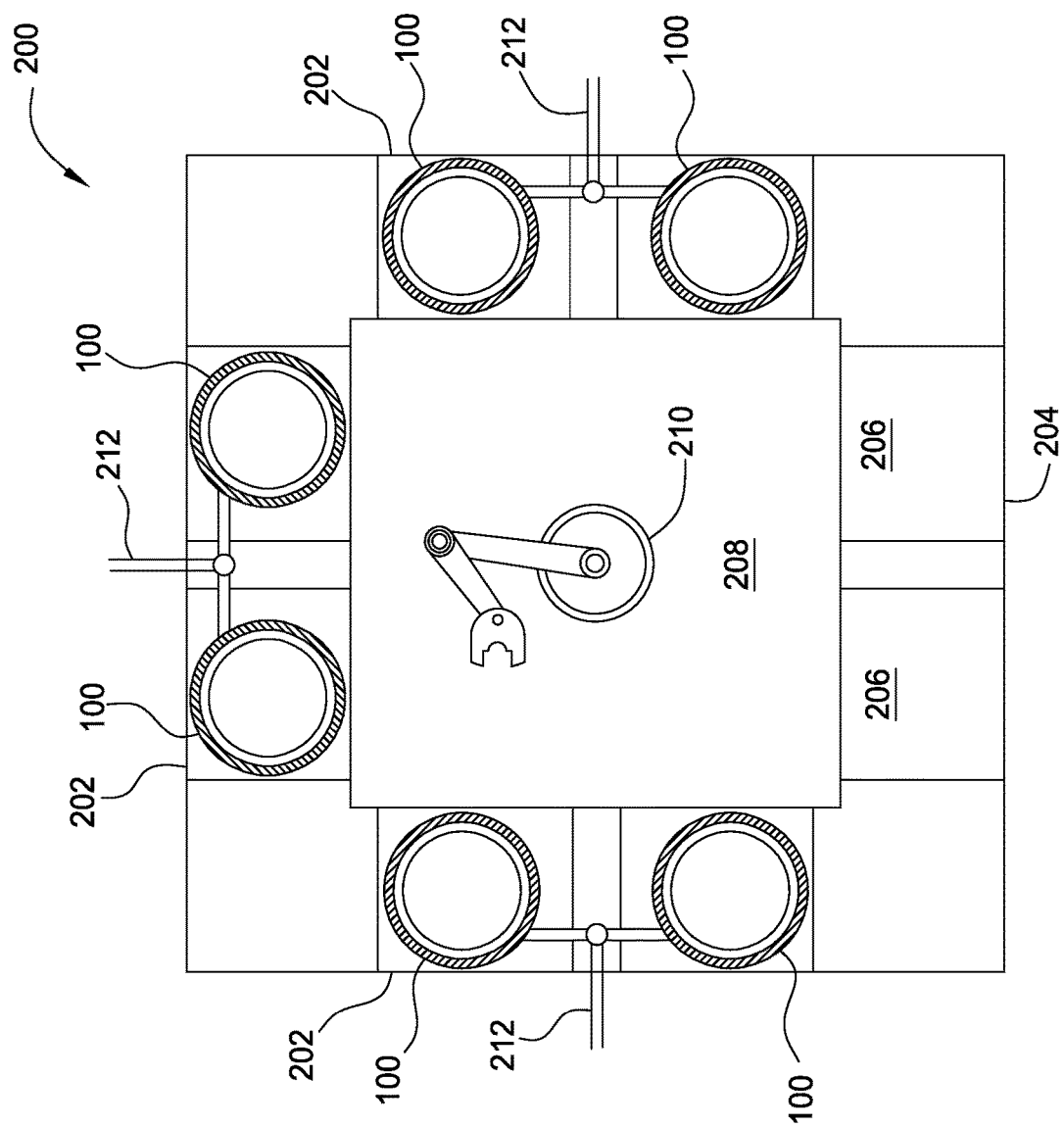
FIG. 2 is a schematic top view of an apparatus 200 according to another embodiment.

FIG. 2 is a schematic top view of an apparatus 200 according to another embodiment. The apparatus 200 is a collection of processing chambers, all of which may be embodiments of the processing chamber 100 of FIG. 1, coupled to a transfer chamber 208 and a load-lock assembly 204. The processing chambers 100 are generally grouped in tandem units 202, each of which has a single supply of process gases 212. The tandem units 202 are positioned around the transfer chamber 208, which typically has a robot 210 for manipulating substrates. The load-locks assembly 204 may feature two load-lock chambers 206, also in a tandem arrangement.

While the foregoing is directed to embodiments of the invention, other and further embodiments of the invention may be devised without departing from the basic scope thereof.

What is claimed is:

1. An apparatus for processing a semiconductor substrate, comprising:
   a chamber body;
   a lid assembly disposed on the chamber body, the lid assembly comprising:
      a conductive gas distributor configured to be coupled to a source of electric power;
      a zoned blocker plate having an outer side wall; and
      a heater comprising an embedded heating element, the heater separably contacting a top surface of the conductive gas distributor and separably disposed around and contacting the outer side wall of the zoned blocker plate, the heater having an exposed top surface.

2. The apparatus of claim 1, wherein the lid assembly further comprises a gas cap, wherein the zoned blocker plate is between the conductive gas distributor and the gas cap.

3. The apparatus of claim 2, wherein the gas cap comprises a fluid circulation conduit, and the gas cap is in thermal communication with the conductive gas distributor.

4. The apparatus of claim 3, wherein the conductive gas distributor has openings, the zoned blocker plate has openings, the gas cap has openings, the openings of the gas cap are in fluid communication with the openings in the zoned blocker plate and the conductive gas distributor, and the openings of the zoned blocker plate are in fluid communication with the openings in the conductive gas distributor.

5. The apparatus of claim 3, wherein the heater separably contacts a periphery of the conductive gas distributor.

6. The apparatus of claim 5, further comprising an electrode disposed between the lid assembly and a wall of the chamber body.

7. The apparatus of claim 6, wherein the electrode is a side wall electrode.

8. The apparatus of claim 2, wherein the conductive gas distributor is a conductive face plate.

9. The apparatus of claim 1, further comprising an electrode disposed between the chamber body and the conductive gas distributor, wherein the electrode is coupled to a tuning circuit that is coupled to ground, wherein the tuning circuit comprises a sensor and a variable capacitor that are coupled to ground.

10. An apparatus for processing a semiconductor substrate, comprising:
    a lid assembly comprising:
       a conductive face plate for coupling to a source of electric power;
       a zoned blocker plate contacting the conductive face plate;
       a cooled gas cap contacting the zoned blocker plate and in thermal communication with the conductive face plate; and
       a heating ring comprising an embedded heating element, the heating ring separably disposed around and in contact with an outer side wall of the zoned blocker plate and in separable contact with a top surface of the conductive face plate, the heating ring having an exposed top surface.

11. The apparatus of claim 10, wherein the heating ring is in separable contact with the top surface of the conductive face plate at the periphery of the conductive face plate.

12. The apparatus of claim 10, wherein the cooled gas cap comprises a cooling fluid conduit.

13. The apparatus of claim 10, wherein the embedded heating element is a fluid conduit.

14. The apparatus of claim 10, wherein the embedded heating element is a resistive heating element.

15. An apparatus for processing a semiconductor substrate in a processing chamber, comprising:
    a lid assembly comprising:
       a conductive face plate for coupling to a source of electric power;
       a zoned blocker plate contacting the conductive face plate;
       a thermally controlled gas cap contacting the zoned blocker plate and in thermal communication with the conductive face plate; and
       a heating ring comprising an embedded heating element, the heating ring separably disposed around and in separable contact with an outer side wall of the zoned blocker plate and in thermal contact with a peripheral region of the conductive face plate, the heating ring having an exposed top surface and an exposed outer sidewall surface.

16. The apparatus of claim 15, wherein the thermally controlled gas cap comprises a conduit for a thermal control fluid.

17. The apparatus of claim 16, wherein the thermal control fluid is a cooling fluid.

18. The apparatus of claim 15, wherein the embedded heating element is a resistive heating element.

* * * * *